(12) United States Patent
Van Wageningen

(10) Patent No.: US 11,293,957 B2
(45) Date of Patent: Apr. 5, 2022

(54) CALCULATING POWER LOSS FOR INDUCTIVE POWER TRANSMISSION

(71) Applicant: Andries Van Wageningen, Eindhoven (NL)

(72) Inventor: Andries Van Wageningen, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 285 days.

(21) Appl. No.: 16/720,077

(22) Filed: Dec. 19, 2019

(65) Prior Publication Data

US 2020/0124648 A1 Apr. 23, 2020

Related U.S. Application Data

(63) Continuation of application No. 15/484,429, filed on Apr. 11, 2017, now Pat. No. 10,545,180, which is a (Continued)

(30) Foreign Application Priority Data

Mar. 21, 2011 (EP) ........................................ 1159036

(51) Int. Cl.
*G01R 21/00* (2006.01)
*H02J 50/60* (2016.01)
(Continued)

(52) U.S. Cl.
CPC ........... *G01R 21/00* (2013.01); *G01R 21/133* (2013.01); *H01F 38/14* (2013.01); *H02J 50/10* (2016.02);
(Continued)

(58) Field of Classification Search
CPC .. H02J 17/00; H02J 5/005; H02J 7/025; H02J 3/01; H02J 50/80; H02J 50/10;
(Continued)

(56) References Cited

U.S. PATENT DOCUMENTS 8,575,944 B2 11/2013 Dorairaj
9,544,022 B2 1/2017 Stevens
(Continued)

FOREIGN PATENT DOCUMENTS

CN 101039154 A 9/2007
EP 2154763 A2 2/2010
(Continued)

OTHER PUBLICATIONS

System Description, Wireless Power Transfer, vol. I: Low Power, Part 1: Interface Definition, Wireless Power Consortium, Version 1.0, Jul. 2010 http://www.wirelesspowerconsortium.com/downloads/wireless-power-specification-part-1.html.

*Primary Examiner* — Hal Kaplan
*Assistant Examiner* — Swarna N Chowdhuri

(57) ABSTRACT

Power loss is calculated in an inductive power transfer system comprising a power transmitter for transmitting power inductively to a power receiver via transmitter coil and receiver coil. The power transmitter obtains time information for time alignment to enable the power transmitter to align the time of calculating the power loss with the power receiver. Power loss is calculated during power transfer according to the obtained time information and received power parameter communicated from the power receiver.

20 Claims, 4 Drawing Sheets

Related U.S. Application Data continuation of application No. 14/003,827, filed as application No. PCT/IB2012/050905 on Mar. 12, 2012, now Pat. No. 9,625,501.

(51) Int. Cl.
  *H02J 50/10* (2016.01)
  *H02J 50/80* (2016.01)
  *H01F 38/14* (2006.01)
  *G01R 21/133* (2006.01)
  *H04B 5/00* (2006.01)

(52) U.S. Cl.
  CPC .............. *H02J 50/60* (2016.02); *H02J 50/80* (2016.02); *H04B 5/0037* (2013.01)

(58) Field of Classification Search
  CPC ........ H02J 50/60; H01F 38/14; B60L 11/182; B60L 11/1829; B60L 11/1831; Y02T 90/122; G01R 21/00; G01R 21/133; H04B 5/0037
  USPC .......................................... 307/104; 324/142
  See application file for complete search history.

(56) References Cited

U.S. PATENT DOCUMENTS

| | | | |
|---|---|---|---|
| 2003/0156658 A1* | 8/2003 | Dartois | H03F 1/3294 |
| | | | 375/297 |
| 2006/0113955 A1 | 6/2006 | Nunally | |
| 2007/0069495 A1* | 3/2007 | Middlebrook | B60G 9/003 |
| | | | 280/124.116 |
| 2007/0273484 A1* | 11/2007 | Cederlof | H04L 67/12 |
| | | | 340/10.33 |
| 2009/0015210 A1 | 1/2009 | Kojima | |
| 2009/0264091 A1* | 10/2009 | Jensen | H03G 3/3047 |
| | | | 455/296 |
| 2010/0079008 A1 | 4/2010 | Hyde | |
| 2011/0196544 A1 | 8/2011 | Baarman | |
| 2013/0147479 A1* | 6/2013 | Bielmeier | G01R 33/36 |
| | | | 324/309 |

FOREIGN PATENT DOCUMENTS

| | | |
|---|---|---|
| WO | WO2007137277 A2 | 11/2007 |
| WO | WO201097608 A2 | 8/2010 |

* cited by examiner

CALCULATING POWER LOSS FOR INDUCTIVE POWER TRANSMISSION

CROSS-REFERENCE TO PRIOR APPLICATIONS

This application a continuation of U.S. patent application Ser. No. 15/484,429 filed on Apr. 11, 2017 which is a continuation of U.S. patent application Ser. No. 14/003,827 filed Sep. 9, 2013 which is a National Stage application of International Application No. PCT/1132012/050905 filed Mar. 12, 2012 which claims the benefit of EP Patent Application No. 11159036.0 filed Mar. 21, 2011. These applications are hereby incorporated by reference herein.

The invention relates to a method of calculating power loss in an inductive power transfer system in a power transmitter.

The invention further relates to method of enabling calculating power loss in an inductive power transfer system in a power receiver.

The invention further relates to a power transmitter, a power receiver and a communication signal.

The invention relates to the field of power transmission technology, particularly to method and device for calculating power loss during power transfer.

Power transfer via magnetic induction is a well known method, mostly applied in transformers, having a tight coupling between primary and secondary coil. By separating primary and secondary coil in two devices, wireless power transfer between these devices becomes possible based on the principle of a loosely coupled transformer. The basic elements for such a system are a power transmitter, containing a primary coil and a power receiver, containing a secondary coil.

The document "System description, Wireless Power Transfer, Volume I: Low Power, Part 1: Interface Definition, Version 1.0 July 2010, published by the Wireless Power Consortium" available via http://www.wirelesspowerconsortium.com/downloads/wireless-power-specification-part-1.html, also called the Qi wireless power specification describes wireless transmission of power.

To prepare and control the power transfer between a power transmitter and a power receiver in such a wireless, inductive power transfer system, the power receiver communicates information to the power transmitter. For example, the power receiver may communicate a data packet indicating the received power, e.g. the rectified power.

A problem is that metal objects, positioned at the surface of the power transmitter, can reach an undesired high temperature (higher than 65° C.) due to eddy currents caused by the magnetic field generated by the power transmitter. This is an unwanted situation. Skin burning and plastic melting could result from this heating.

It is an object of this invention to provide a method and devices for power transmission that allow the transmitter to avoid heating metal objects.

For this purpose, according to a first aspect of the invention, a method of calculating power loss in an inductive power transfer system comprising a power transmitter for transmitting power inductively to a power receiver via a transmitter coil and a receiver coil, comprises steps of, by the power transmitter:

obtaining a received power parameter communicated from the power receiver;

obtaining time information for time alignment communicated from the power receiver to enable the power transmitter to align, with the power receiver, the time of calculating a power loss during power transfer;

calculating the power loss according to the obtained time information and the received power parameter.

For this purpose, according to a further aspect of the invention, a method of enabling calculating power loss in an inductive power transfer system comprising a power transmitter for transmitting power inductively to a power receiver via a transmitter coil and a receiver coil, comprises steps of, by the power receiver:

communicating, to the power transmitter, time information for time alignment to enable the power transmitter to align, with the power receiver, the time of calculating a power loss during power transfer;

determining a received power parameter according to the time information and communicating, to the power transmitter, the received power parameter.

The measures have the effect that power loss is accurately determined because the received power and the transmitted power are determined according to the same time information, e.g. in a same, aligned, time window. The power loss in a metal object can be estimated by taking the difference between the net transmitted power and the gross received power. To prevent that too much power is dissipated into a metal object, the power transmitter terminates power transfer if the power loss exceeds a threshold. Advantageously metal objects are prevented to heat up by determining the power loss that is not part of the normal power loss of the system.

For this purpose, according to a further aspect of the invention, a power receiver comprises a communication unit for communicating with a power transmitter for transmitting power inductively to the power receiver via a transmitter coil and a receiver coil, the power receiver being arranged for determining a received power parameter according to time information and the communication unit being arranged for communicating the received power parameter and for communicating the time information for time alignment to enable the power transmitter to align, with the power receiver, the time of calculating of power loss during power transfer.

For this purpose, according to a further aspect of the invention, a power transmitter comprises a communication unit for communicating with a power receiver arranged for receiving power inductively from the power transmitter via a transmitter coil and a receiver coil, the communication unit being arranged for communicating a received power parameter and time information for time alignment, the power transmitter being arranged for calculating power loss during the transfer of power from the power transmitter to the power receiver according to the received power parameter communicated from the power receiver during power transfer and by applying the time information communicated from the power receiver for the calculation of the power loss between power transmitter and power receiver.

For this purpose, according to a further aspect of the invention, a communication signal for communicating to a power transmitter from a power receiver arranged for receiving power inductively from the power transmitter via a transmitter coil and a receiver coil, is arranged for communicating a received power parameter and time information for time alignment, to enable the power transmitter to align, with the power receiver, the time of calculating a power loss during power transfer for the calculation of the power loss between power transmitter and power receiver.

Advantageously the devices and signal constitute a system for wireless power transfer, which system is enabled to calculate power loss during the transfer of power from the power transmitter to the power receiver according to the received power parameter and the time information for the calculation of the power loss between power transmitter and power receiver.

Optionally, in the methods, devices and/or signal, the time information comprises the size of a time-window and an offset of the time-window to a time reference point.

Optionally, a method of calculating power loss in an inductive power transfer system comprising a power transmitter for transmitting power inductively to a power receiver via transmitter coil and receiver coil, the method comprising steps of:

obtaining, by power transmitter, time information for time alignment to enable the power transmitter to align the time of calculating the power loss with the power receiver;

calculating power loss during power transfer according to the obtained time information and received power parameter communicated from the power receiver.

Optionally, the timing information comprises of the size of a time-window and its offset to a time reference point.

Optionally, the time reference point is related to the communication of a packet from power receiver to power transmitter.

Optionally, the time reference corresponds to the end of communicating a given bit of packet.

Optionally, the packet to which the time reference relates contains the received power information that the power transmitter applies to calculate the power loss.

Optionally, the packet to which the time reference relates precedes the packet which contains the received power information that the power transmitter applies to calculate the power loss.

Optionally, the size of said time-window is reduced to zero or to relatively small value, whereby the power receiver takes a single measurement to determine the received power and the power transmitter calculates the power loss aligned to this measurement.

Optionally, a power receiver comprises a unit for communicating parameters related to time align parameters before power transfer to enable the power transmitter to align with the power receiver the time of calculating of power loss during power transfer.

Optionally, a power receiver further comprises a unit for communicating its received power to the power transmitter by:
a single data entity, or
by two data entities, wherein the first data entity containing the output value and the second entity containing information on the power loss in the receiver, or mobile device from which the power transmitter can calculate the received power.

Optionally, a power transmitter comprises unit for calculating power loss during the transfer of power from the power transmitter to the power receiver according to the received power communicated from the power receiver during power transfer and by applying timing information communicated from the power receiver before power transfer for time-alignment for the calculation of the power loss between power transmitter and power receiver.

Optionally, a power transmitter may also comprise:

a unit for applying multiple instances of received power information communicated by the power receiver to increase the robustness of the power loss calculation method;

a unit for terminating the power transfer if for two or more succeeding instances the power loss exceeds a threshold;

a unit for taking the average of two or more succeeding instances for calculating an average power loss over these instances.

The invention also comprises a power transfer system containing a power transmitter as described above, and a power receiver as described above.

Further preferred embodiments of the device and method according to the invention are given in the appended claims, disclosure of which is incorporated herein by reference.

These and other aspects of the invention will be apparent from and elucidated further with reference to the embodiments described by way of example in the following description and with reference to the accompanying drawings, in which FIG. 1 shows an example of the change of the received power and the transmitted power as a result of a load step;

FIG. 2 illustrates the definition of the time window according to embodiment; and FIG. 3 depicts an embodiment of how to determine the time reference. The figures are purely diagrammatic and not drawn to scale. In the Figures, elements which correspond to elements already described have the same reference numerals.

A method to prevent a metal object to heat up is to determine the power loss that is not part of the normal power loss of the system. The power loss in a metal object can be estimated by taking the difference between the net transmitted power and the gross received power. To prevent that too much power is dissipated into a metal object, the power transmitter terminates power transfer if the power loss exceeds a threshold.

To determine the power loss the power receiver estimates its gross received power e.g. by measuring its rectified voltage and current, multiplying current and voltage, and adding an estimation of the internal power losses in the power receiver. The power receiver communicates the received power to the power transmitter, e.g. with a minimum rate such as every 5 seconds. Such minimum rate means that the distance in time between the ends of two succeeding received power information data is maximally 5 seconds.

The power transmitter estimates its net transmitted power e.g. by measuring the input voltage and current, multiplying the input voltage and current, and subtracting from the intermediate result an estimation of the internal power losses of the power transmitter. The power transmitter then calculates the power loss by subtracting the communicated received power from the transmitted power. If the difference exceeds a threshold, the power transmitter assumes that too much power is dissipated in a metal object and terminates power transfer.

A termination Criterion is defined by:

$$P_T - P_R > \text{threshold}$$

with:

$P_T$=estimated net transmitted power
$P_R$=estimated gross received power
$P_T-P_R$=estimated power loss
Threshold=safety limit The threshold may incorporate the inaccuracy of the estimated transmitted power and received power. It is of importance to achieve high accuracy in the estimation of the transmitted and received power and to mitigate the error in the calculation of the power loss.

If the output load fluctuates over time, an error will occur in the calculation of the power loss if the measurements and estimation of the transmitted and received power are not aligned in time. This error can be mitigated by taking the average of the transmitted power and received power over some longer period of time.

A possible implementation of averaging the power measurement is to add multiple samples of the instantaneous measurements and divide the result by the number of samples over a period of time.

Another possible implementation is to take the contribution of each new sample proportionally to the previous calculated average. So for example if a power receiver takes 20 samples over a certain period, the new average would be:

New Sample*1/20+Old Average*19/20.

Yet another possibility is to apply a low pass filter to damp the contribution of the actual measured value. This could e.g. be realized with a capacitor that is connected to the measured signal via a resistor.

Figure 1:
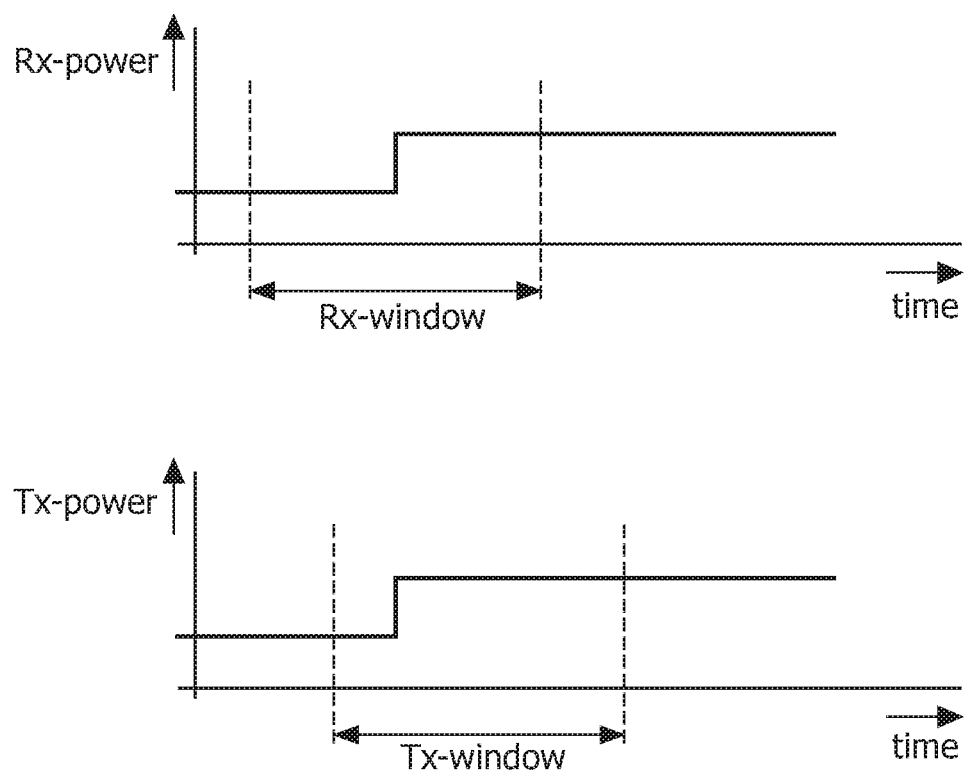

FIG. 1 shows an example of the change of the received power and the transmitted power as a result of a load step. The period over which the power receiver averages its received power is not known by the power transmitter and may vary from design to design. This problem is illustrated by FIG. 1. The figure shows the change of the received power (Rx-power) and the transmitted power (Tx-power) as a result of a load step (a sudden increase or decrease of the load).

In FIG. 1 the window over which the average transmitted power is taken (Tx-window) is not aligned to the window over which the average received power is taken (Rx-window). For example if both the Tx and Rx power change from 1 W to 5 W as result of a load step, the average received power in the Rx-window will be 3 W and the transmitted power in the Tx-window will 4 W leading to an (additional) error of 1 W in the estimation of the power loss.

As a solution, the power transmitter and power receiver could measure respectively the average transmitted power and average received power over the period between two succeeding received power packets. This method will however fail if a received power packet does not arrive at the power transmitter due to a communication error.

The invention reduces the error in the power loss detection method that is caused by a dynamic output load by aligning the estimation of transmitted power to that of the received power in time. For this purpose, the power transmitter will obtain information for aligning the time of measuring the transmitted power and received power. This information could be for example a time window parameter for setting a time-window to the power transmitter during the configuration phase to enable the power transmitter to align its transmitted power estimation to the received power estimation by applying this time-window.

To enable the power transmitter to eliminate, or mitigate the calculation error of the power loss for the above described power loss method in case the output load fluctuates, the power transmitter needs information on the period in time for which the power loss has to be calculated.

For this purpose the power receiver communicates the parameters determining the setting for a time-window during the configuration of the system. The power transmitter applies the window-setting to align the estimation of its transmitted power to that of the received power.

There could be pre-stored a default time window in the power transmitter. In case the power receiver does not communicate such timing parameters, the power transmitter applies default values for them.

The time window is determined by the following two parameters.

1. Window size—e.g. an 8 bit value. The range of this parameter could be e.g. from 0 sec to 12.750 sec. A reasonable value for the window size could be 1 sec. The default value could be 1 s as well. The window size may also be reduced to a relatively small value, e.g. 100 msec or 255 msec.
2. Window offset—e.g. an 8 bit value. This value indicates the offset of the time-window to a time-reference. Preferably the offset is defined between the end of the time window and the reference point, but it is also possible to use the start point of the time window to determine the offset to the reference. The range of the offset parameter could be e.g. from 0 msec to 255 msec. A reasonable value for the offset could be 100 msec. The default value could be 100 msec as well.
3. The time-reference can be defined according to a time a certain bit of a packet is communicated from power receiver to power transmitter. The packet is preferably the received power packet which the power transmitter applies to calculate the power loss, because by receiving this packet, the power transmitter can be sure to have the right relation between the received power information and the time-window over which it needs to calculate the power loss.

Example embodiments to determine the time-reference are the following:

a. The time-reference is determined by (the end of) the communication of the last bit of the received power packet. Typically the length and therefore the time to communicate the received power packet is known by the power receiver (e.g. 20 ms) and also the time to calculate the received power from the measurements (e.g. 80 ms) is known by the power receiver designer–meaning that the window offset can be determined quite accurately (e.g. 100 ms).

b. The time-reference is determined by the communication of the first bit of the received power packet. This timing could be a little more accurate since the inaccuracy of the packet transfer time is now eliminated. The power transmitter however has to store the time of the reception of the first bit of a packet and wait for the reception of the remaining part of the packet before it knows that the bit is part of a received power packet.

Figure 2:
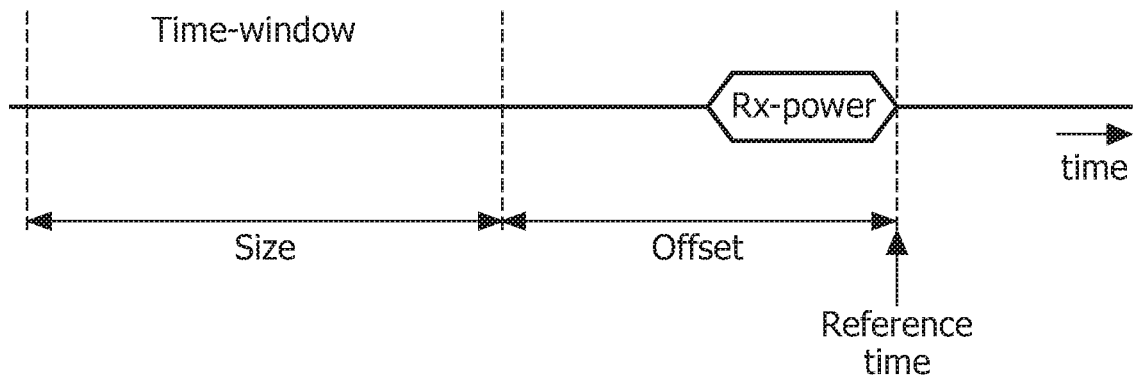

FIG. 2 illustrates the definition of the time window according to embodiment a. in which the reference time is defined by the end of the communication of the last bit of the received power packet (Rx-Power). The time between the end of the time-window and the reference time is determined by the window offset. The time between the start and the end of the window is determined by the window size.

A possible implementation for the power transmitter is to sample its average power over small time steps and to store these values in memory. A step value could for example be 10 ms. After the reception of a received power packet the power transmitter looks up the stored values and calculates the average value over the configured time-window. With a window-size of 1000 ms and a window-offset to the last bit of the received power packet of 100 ms, the power transmitter has to store e.g. 110 samples. The power transmitter can store the transmitted power samples circularly whereby it overwrites the oldest sample with the newest.

The robustness of the power loss method can be improved if the power transmitter does not terminate the power transfer based on the information carried in a single power received message.

The power transmitter could wait for one, or more additional received power packets before terminating the power transfer. So if the power-loss threshold would be exceeded according to the information on a single received power packet, the power transmitter could decide to delay the decision to terminate the power transfer to the reception of a succeeding packet.

It could terminate the power transfer if for each of two or more succeeding received power packets, the power loss exceeds the threshold.

It could average the calculated power loss corresponding to the last two or more received power packets and terminate the power transfer if this average exceeds a threshold.

The received power can be communicated from power receiver to power transmitter by means of a received power packet as indicated in the above descriptions. The invention however is not limited to this form of communicating the received power.

The power receiver could communicate its received power also in other forms, like
Communicating (any form of) output power, like e.g. the rectified output power and in addition information which enables the power transmitter to calculate the received power from the output power. The additional information could be communicated as separate packet, but also included with the output power information in a single packet and could for example contain:
1. Actual power loss in the receiver which the power transmitter should add to the output power to calculate the received power. This information is preferably communicated within the same packet as the output power, or in a separate packet shortly before or after an output power packet.
2. Power correction factor which the power transmitter should multiply with the output power and power offset factor which the power transmitter should add to the output power to calculate the received power. Such correction information could be communicated by the receiver during configuration in order to reduce the communication overhead during power transfer.

The invention applies a window-offset towards a reference time. The above description makes use of the received power packet to relate such reference time, which is later than the time-window that is applied for the power loss calculation. Other methods to determine such reference point are however also possible. The following are some additional examples for time reference.

Figure 3:
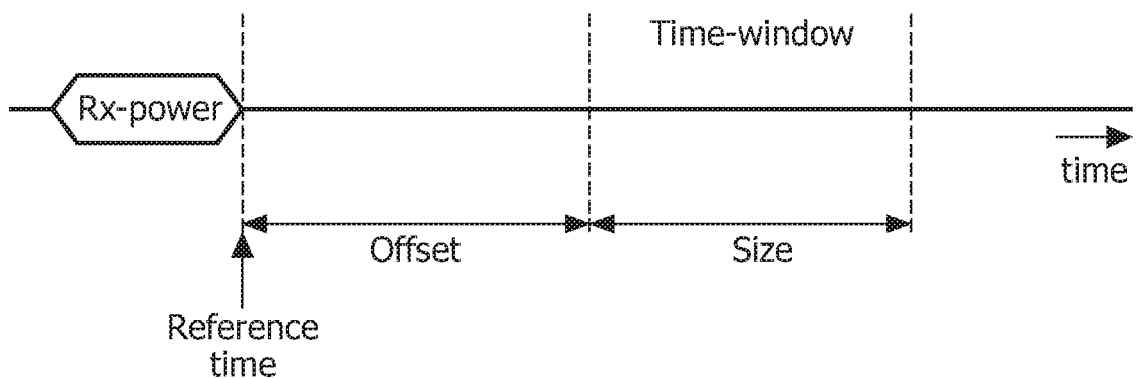

FIG. 3 depicts an embodiment of how to determine the time reference. The power receiver could send the received power packet at time equal distances; if the power transmitter is informed about the time distance between these packets, it is possible to use the previous communicated received power packet for the time reference. FIG. 3 illustrates how to use the previous communicated received power packet for the time reference. The last bit of the previous received power packet is the reference time. The time window starts at the window offset after this reference time. The advantage is that the power transmitter does not have to store the samples in order to determine its average transmitted power from the past. It can determine its average transmitted power during the time window. It only has to store the resulting average power over the time window until the next received power packet to receive. In case the power transmitter would not receive the next received power packet due to a communication error, it can apply a time-out to discard the last stored average transmitted power and use the information on the expected time between two succeeding received power packets to start determining the average transmitted power for the next time window.

For this method it is needed that the power transmitter is informed on the time distance between two succeeding received power packets. This could be arranged by using a default value and/or by communicating such value from power receiver to power transmitter, e.g. at the configuration phase of the system. In this method the power receiver should not deviate the time between communicating two succeeding packets too much to keep the power transmitter aligned. This could be a problem in case other control packets have to be communicated with higher priority and cause a delay in communicating the received power packet. Hence the received power packet must have a high priority.

Another possibility is that the power receiver synchronizes to a signal from the power transmitter. In case the system allows communication from Power transmitter to power receiver, e.g. by modulating the amplitude, frequency, or phase of the power signal, the power transmitter could send a synchronization datum at regular time intervals. Such datum could also function as time reference for a time window. The time window could e.g. be exactly the time between two succeeding synchronization data.

The system applies a window over which the received power and transmitted power are averaged. An embodiment includes the possibility to reduce the window size to zero. This means that instead of the average values of received power and transmitted power, the instance values are taken to realize the power loss method. A practical way of implementation could be to apply a very small window size in which the power receiver takes a (single) measurement to determine its received power and in which the power transmitter takes a (single) measurement to determine its transmitted power. This embodiment is less robust compared to an embodiment in which the average of multiple measured values over a time window with larger size is taken. Robustness can however be improved as described earlier.

In a practical embodiment the Window Offset indicates the interval between the window for averaging the received power and the beginning of transmission of the respective Received Power Packet. The value of the Window Offset may be expressed in units by a data value in a data packet to be transferred from the power receiver to the power transmitter, e.g. 3 bits. A further data value may indicate the Window Size, e.g. 5 bits. The values may be expressed in units of a few msec, e.g. 4 msec. Advantageously units of 8 msec are used, which allows for a maximum window size of 252 msec instead of 124 msec.

It is noted that the time window may be a relatively long period, e.g. 1 sec, but also a relative short period, e.g. 64 msec. The shorter period enables to measure the power only while no communication between Rx and Tx takes place. Amplitude modulation due to communication makes measurements less accurate. For example, the shorter period allows defining the time window to be from the end of the preceding packet (e.g. the preceding received power packet)

to the beginning of the current received power packet, or from the end of the preceding packet to the end of the preceding packet + the window size as defined.

Figure 4:
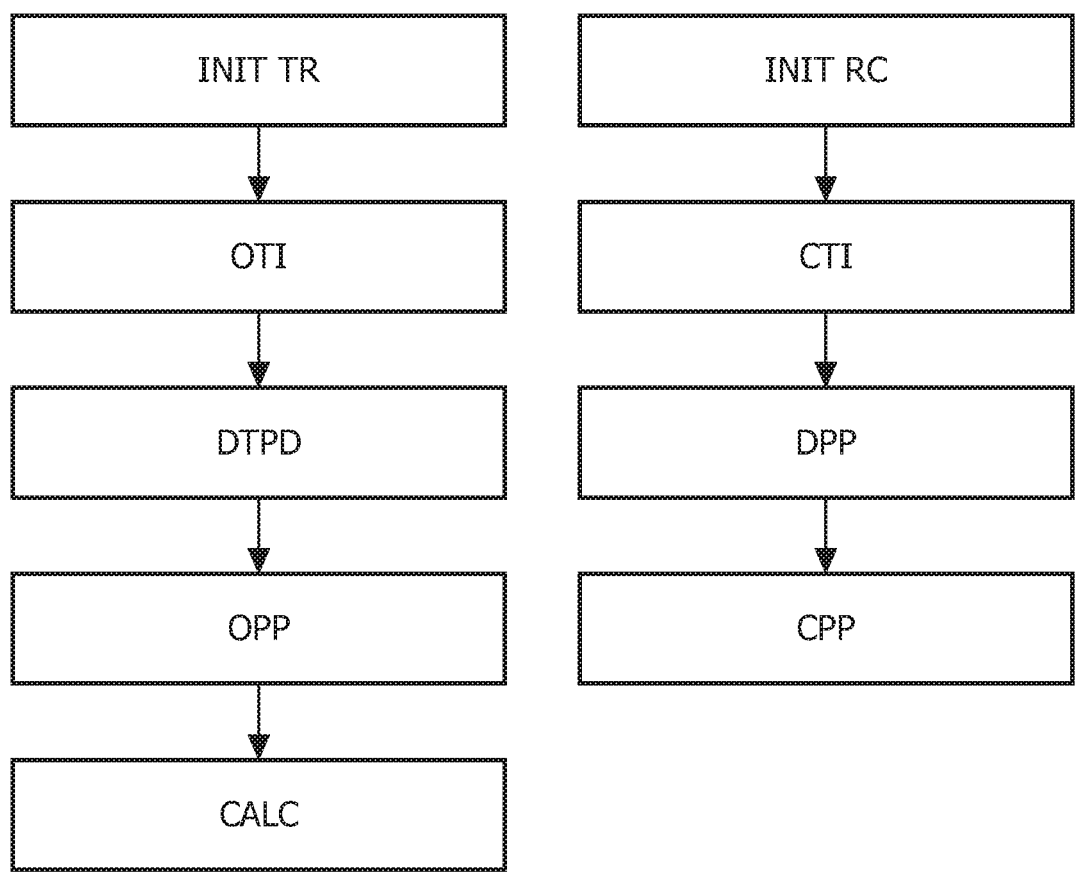
FIG. 4 shows a method of calculating power loss, and a method of enabling calculating power loss in an inductive power transfer system.

FIG. 4 shows a method of calculating power loss, and a method of enabling calculating power loss in an inductive power transfer system. The inductive power transfer system has a power transmitter for transmitting power inductively to a power receiver via a transmitter coil and a receiver coil. The method of calculating power loss starts after the inductive power system has initiating transferring power, as shown by step INIT TR (initialize transmitting). Then the method proceeds by performing, by the power transmitter, the following steps. The method obtains, in step OTI (obtain time information), time information for time alignment communicated from the power receiver. The time information enables the power transmitter to align, with the power receiver, the time of calculating a power loss during power transfer. The method determines transmitted power data in step DTPD (determine transmitted power data). The method obtains a received power parameter communicated from the power receiver in step OPP (obtain power parameter). Then the method proceeds, in step CALC (calculate), by calculating the power loss according to the obtained time information, the determined transmitted power data and the received power parameter.

The figure also shows the method of enabling calculating power loss by the steps performed by the power receiver. The method starts after the inductive power system has initiating transferring power, as shown by step INIT RC (initialize receiving). The method communicates in step CTI (communicate time information), by the power receiver to the power transmitter, time information for time alignment. The time information enables the power transmitter to align, with the power receiver, the time of calculating a power loss during power transfer. In step DPP (determine power parameter), a received power parameter is determined according to the time information, e.g. in a time window as defined by the time information. Then the method proceeds to communicate, in step CPP (communicate power parameter) to the power transmitter, the received power parameter.

Figure 5:
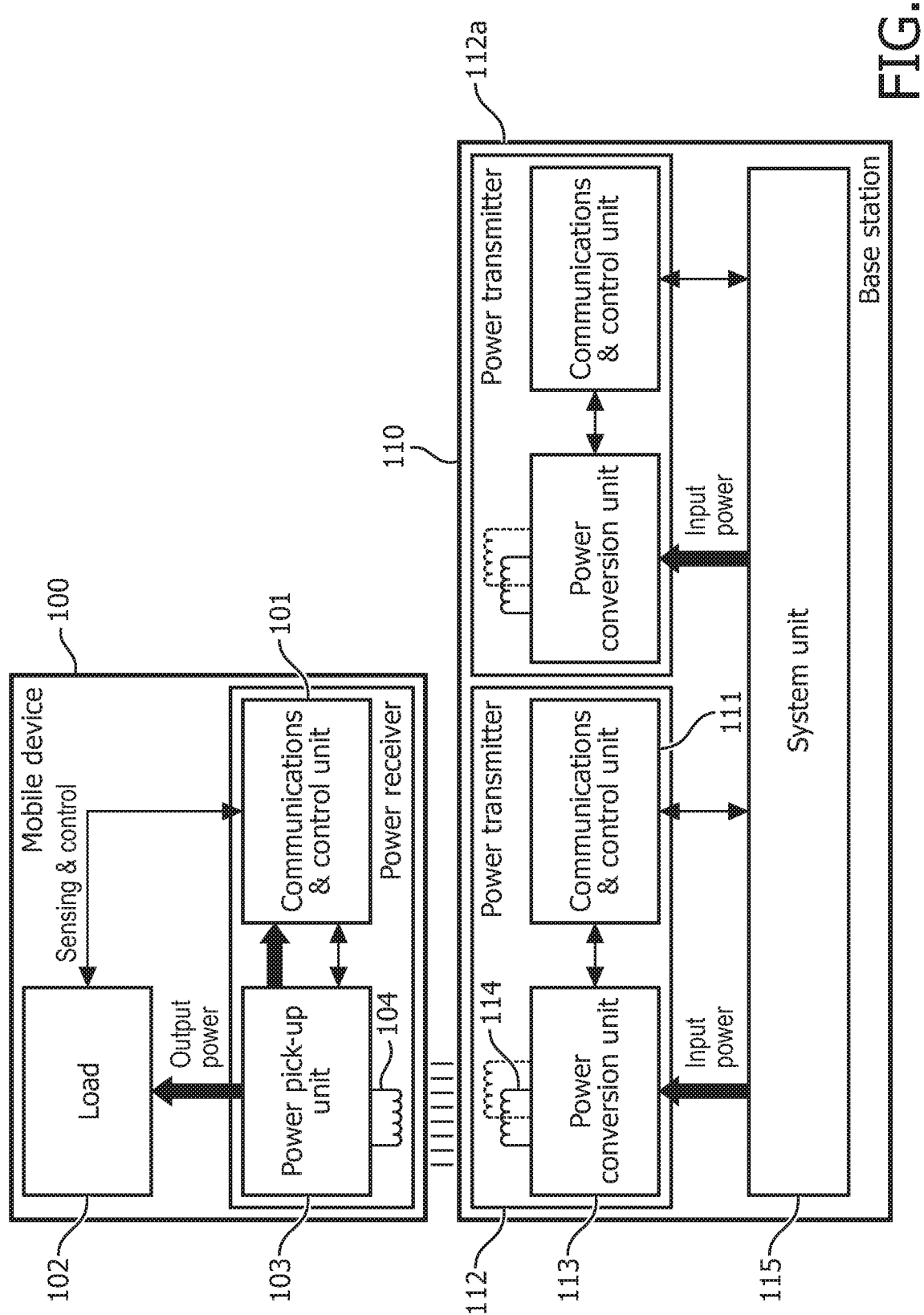
FIG. 5 shows a transmitter and a receiver in an inductive power system.

FIG. 5 shows a transmitter and a receiver in an inductive power system. A power supply device 110, also called base station, has at least one power transmitter 112,112a and a system unit 115 for controlling the inductive power system. A transmitter coil 114, also called primary coil is shown connected to a transmitter power conversion unit 113, which is coupled to a controller 111, also called a communications and control unit. The transmitter power conversion unit 113 converts input power to transfer power to be magnetically transferred from the transmitter coil to the receiver coil. The transmitter communication unit 111 is coupled to the power conversion unit for receiving the communication signal via the transmitter coil from the receiver coil.

A power receiver 100, usually a mobile device, has a receiver coil 104, also called secondary coil, which is shown connected to a power pick-up unit 103 which provides output power to a load 102. The power pickup unit is coupled to a receiver communication and control unit 101. The receiver communication and control unit is arranged for driving the receiver coil for transmitting a communication signal via receiver coil to the transmitter coil, and is coupled to the load 102 to sense and control the load power status. The inductive power transfer system as shown in FIG. 4 is based on the well known Qi standard. The communication and control units in the transmitter and the receiver are adapted to perform the functions as defined above with reference to FIGS. 1, 2 and 3.

In summary, the invention proposes a method of calculating power loss in an inductive power transfer system comprising a power transmitter for transmitting power inductively to a power receiver via transmitter coil and receiver coil, the method comprising a step of obtaining, by power transmitter, time information for time alignment to enable the power transmitter to align the time of calculating the power loss with the power receiver; and a step of calculating power loss during power transfer according to the obtained time information and received power parameter communicated from the power receiver.

It is to be noted that the invention may be implemented in hardware and/or software, using programmable components. Methods for implementing the invention have the steps corresponding to the functions defined for the system as described above.

Although the present invention has been described in connection with some embodiments, it is not intended to be limited to the specific form set forth herein. Additionally, although a feature may appear to be described in connection with particular embodiments, one skilled in the art would recognize that various features of the described embodiments may be combined in accordance with the invention. In the claims, the term comprising does not exclude the presence of other elements or steps.

Furthermore, although individually listed, a plurality of means, elements or method steps may be implemented by e.g. a single unit or processor. Additionally, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Furthermore, the order of features in the claims do not imply any specific order in which the features must be worked and in particular the order of individual steps in a method claim does not imply that the steps must be performed in this order. Rather, the steps may be performed in any suitable order. In addition, singular references do not exclude a plurality. Thus references to "a", "an", "first", "second" etc do not preclude a plurality. Reference signs in the claims are provided merely as a clarifying example shall not be construed as limiting the scope of the claims in any way.

The invention claimed is:

1. A method of enabling the calculation of power loss in a wireless power transfer system, the method comprising;
communicating, by a wireless power receiver to a wireless power transmitter, first time information indicating the length of a measurement time window during which power transfer is to be measured, and second time information indicating a time alignment to enable the wireless power transmitter to align a measurement time window of the wireless power transmitter with a measurement time window of the wireless power receiver;
measuring power received at the wireless power receiver during the measurement time window; and
communicating to the wireless power transmitter a received power parameter indicating the measured power received by the wireless power receiver.

2. The method of claim 1, wherein the wireless power parameter is configured to be utilized by the wireless power transmitter to determine power loss during wireless power transfer from the wireless power transmitter to the wireless power receiver.

3. The method of claim 1, wherein the second time information indicates an offset of the measurement time window relative to a time reference point.

4. The method of claim 3, wherein the time reference point is associated with a data packet for communicating the received power parameter.

5. The method of claim 1, wherein measuring power received comprises determining an average power received during the measurement time window.

6. A wireless power receiver, comprising;
a wireless power receiver coil configured to receive power wirelessly from a wireless power transmitter;
communication circuitry configured to communicate to a wireless power transmitter first time information indicating the length of a measurement time window during which power transfer is to be measured, and second time information indicating a time alignment to enable the wireless power transmitter to align a measurement time window of the wireless power transmitter with a measurement time window of the wireless power receiver; and
processing circuitry configured to measure power received at the wireless power receiver during the measurement time window, wherein the communication circuitry is configured to communicate to the wireless power transmitter a received power parameter indicating the measured power received by the wireless power receiver.

7. The wireless power receiver of claim 6, wherein the wireless power parameter is configured to be utilized by the wireless power transmitter to determine power loss during wireless power transfer from the wireless power transmitter to the wireless power receiver.

8. The wireless power receiver of claim 6, wherein the second time information indicates an offset of the measurement time window relative to a time reference point.

9. The wireless power receiver of claim 8, wherein the time reference point is associated with the communication of a packet from the wireless power receiver to the wireless power transmitter.

10. The wireless power receiver of claim 8, wherein the time reference point is associated with a data packet for communicating the received power parameter.

11. The wireless power receiver of claim 6, wherein the processing circuitry is configured to measure the power received by determining an average power received during the measurement time window.

12. The wireless power receiver of claim 6, wherein the processing circuitry is configured to adjust the measurement of power received based on an estimate of the internal power losses of the wireless power receiver.

13. The wireless power receiver of claim 6, wherein the communication circuitry is configured to communicate the first time information and the second time information during a configuration phase of communication with the wireless power transmitter.

14. A power transmitter, comprising:
a wireless power transmitter coil configured to transmit power wirelessly to a wireless power receiver;
communication circuitry configured to receive from a wireless power receiver first time information indicating the length of a measurement time window during which power transfer is to be measured, and second time information indicating a time alignment to enable the wireless power transmitter to align a measurement time window of the wireless power transmitter with a measurement time window of the wireless power receiver, wherein the communication circuitry is further configured to receive a received wireless power parameter indicating the wireless power received by the wireless power receiver during the measurement time window; and
processing circuitry configured to measure power transmitted by the wireless power transmitter during the measurement time window, wherein the processing circuitry is configured to determine an indication of power loss based on the measured power transmitted and the received wireless power parameter.

15. The wireless power transmitter of claim 14, wherein the second time information indicates an offset of the measurement time window relative to a time reference point.

16. The wireless power transmitter of claim 15, wherein the time reference point is associated with the communication of a packet from the wireless power receiver to the wireless power transmitter.

17. The wireless power transmitter of claim 15, wherein the time reference point is associated with a data packet for communicating the received power parameter.

18. The wireless power transmitter of claim 14, wherein the processing circuitry is configured to measure the power received by determining an average power received during the time window.

19. The wireless power transmitter of claim 14, wherein the processing circuitry is configured to adjust the measurement of power received based on an estimate of the internal power losses of the wireless power transmitter.

20. The wireless power transmitter of claim 14, wherein the processing circuitry is configured to determine that a foreign object is present when the power loss exceeds a threshold value.

* * * * *